United States Patent

Guo et al.

[11] Patent Number: 5,506,534
[45] Date of Patent: Apr. 9, 1996

[54] DIGITALLY ADJUSTABLE PICOSECOND DELAY CIRCUIT

[75] Inventors: Bin Guo, Fremont; Arthur Hsu, San Jose, both of Calif.

[73] Assignee: Advanced Micro Devices, Inc., Sunnyvale, Calif.

[21] Appl. No.: 445,891

[22] Filed: May 22, 1995

Related U.S. Application Data

[63] Continuation of Ser. No. 132,006, Oct. 5, 1993, abandoned.

[51] Int. Cl.⁶ ............................................. H03K 5/13
[52] U.S. Cl. ..................... 327/276; 327/281; 327/288; 327/394
[58] Field of Search ............................ 327/276, 277, 327/278, 281, 288, 394, 395

[56] References Cited

U.S. PATENT DOCUMENTS

| | | | |
|---|---|---|---|
| 3,737,673 | 6/1973 | Suzuki | 307/452 |
| 4,482,826 | 11/1984 | Ems | 307/602 |
| 4,709,170 | 11/1987 | Li | 328/55 |
| 4,742,254 | 5/1988 | Tomisawa | 307/606 |
| 4,806,804 | 2/1989 | O'Leary | 307/605 |
| 4,899,071 | 2/1990 | Morales | 307/605 |
| 5,012,141 | 4/1991 | Tomisawa | 307/594 |
| 5,012,142 | 4/1991 | Sonntag | 307/602 |
| 5,028,824 | 7/1991 | Young | 307/601 |
| 5,111,085 | 5/1992 | Stewart | 307/603 |
| 5,175,452 | 12/1992 | Lupi et al. | 307/603 |
| 5,258,659 | 11/1993 | Kannegundla | 307/601 |
| 5,278,522 | 1/1994 | Atriss et al. | 307/603 |
| 5,302,920 | 4/1994 | Bitting | 307/603 |
| 5,317,219 | 5/1994 | Lupi et al. | 307/603 |

FOREIGN PATENT DOCUMENTS

| | | | |
|---|---|---|---|
| 0474534 | 3/1992 | European Pat. Off. | H03H 11/26 |
| 2246256 | 1/1992 | United Kingdom | H03K 5/00 |

OTHER PUBLICATIONS

Patent Abstracts of Japan vol. 10, No. 213 (E–422)(2269) 14 Mar. 1986 & JP-A-61 052 022 (Hitachi).

*Primary Examiner*—Peter S. Wong
*Assistant Examiner*—Shawn Riley
*Attorney, Agent, or Firm*—Gerald M. Fisher

[57] ABSTRACT

A digitally adjustable time delay circuit which is able to precisely and selectively provide fine delay steps increments, which increments can be one nth of the delay time of one CMOS inverter, including means to adjust the total range of the delay and size of each delay step.

4 Claims, 7 Drawing Sheets

| Control Code | fs0 | fs1 | fs2 | fs3 | fs4 | fs5 | fs6 | fs7 | fs8 | fs9 |
|---|---|---|---|---|---|---|---|---|---|---|
| 0 | 1 | 1 | 1 | 1 | 1 | 1 | 1 | 1 | 1 | 1 |
| 1 | 1 | 1 | 1 | 1 | 1 | 1 | 1 | 1 | 1 | 0 |
| 2 | 1 | 1 | 1 | 1 | 1 | 1 | 1 | 1 | 0 | 0 |
| 3 | 1 | 1 | 1 | 1 | 1 | 1 | 1 | 0 | 0 | 0 |
| 4 | 1 | 1 | 1 | 1 | 1 | 1 | 0 | 0 | 0 | 0 |
| 5 | 1 | 1 | 1 | 1 | 1 | 0 | 0 | 0 | 0 | 0 |
| 6 | 1 | 1 | 1 | 1 | 0 | 0 | 0 | 0 | 0 | 0 |
| 7 | 1 | 1 | 1 | 0 | 0 | 0 | 0 | 0 | 0 | 0 |
| 8 | 1 | 1 | 0 | 0 | 0 | 0 | 0 | 0 | 0 | 0 |
| 9 | 1 | 0 | 0 | 0 | 0 | 0 | 0 | 0 | 0 | 0 |

DIGITALLY ADJUSTABLE PICOSECOND DELAY CIRCUIT

This application is a continuation of application Ser. No. 08/132,006 filed Oct. 5, 1993 now abandoned.

FIELD OF THE INVENTION

This invention relates to the field of time delays and in particular to digitally controllable time delays having very high resolution.

BACKGROUND OF THE INVENTION

Synchronization and clock/data recovery operations and related phase and timing applications require timing adjustments after a timing or phase error is detected. Digital approaches are now starting to take the place of analog phase locked loop approaches for data recovery. Due to the advent of integrated circuit technology and especially the development of the complimentary metal oxide silicon (CMOS) circuits, inexpensive all digital data recovery circuit are now possible. For example, delay techniques are known which employ a long chain of single stage CMOS inverters wherein the delay of the single inverter gate is the minimum delay step and the total delay is controlled by selecting the length of the chain. As the requirement for increased frequency of data transmission advances, a need arises to meet timing requirements having finer timing resolution than the delay through a single CMOS inverter stage. Currently the achievable smallest inverter stage delay is in the range of a few hundred picoseconds.

It is known that bias control of a gate will vary the propagation time through a single gate. This concept has been previously employed with analog control but requires expensive noise filtering.

SUMMARY OF THE INVENTION

It is an object of this invention to provide an all digital time delay implementation without a requirement for noise filtering; but which has finer delay resolution than is a available from a single stage so that the propagation delay of a single stage may be subdivided to provide delay increments which are a selectable fraction of the progation delay of a single stage.

It is further object to employ CMOS manufacturing processes and CMOS circuits with a digitally controllable value of resistance and capacitance to provide predetermined steps in the fall time of the CMOS output responsive to a step input.

It is a still further object to obtain fine delay steps in uniform increments.

It is yet a further object to employ CMOS manufacturing processes to provide flexible designs which permit selection of minimum delay step size and total delay range by selection of the ratio of the channel width aspect ratio of one of the CMOS transistors.

DETAILED DESCRIPTION OF THE INVENTION

Figure 1A:
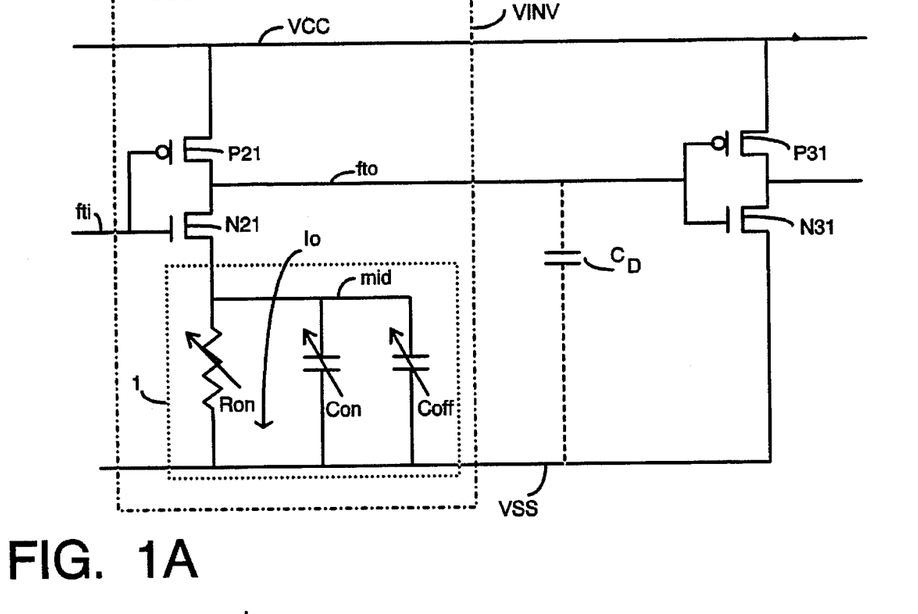
FIG. 1A is a schematic equivalent circuit of the inventions.

With reference to FIG. 1A, an explanatory equivalent CMOS inverter gate circuit VINV comprising p21 and n21 is shown in series with common input fti and common output fto. The most positive supply voltage VCC is connected to the source of p21 and most negative voltage Vss is connected to the source of n21 through a variable impedance circuit 1 represented as a parallel variable resistor and variable capacitor network, consisting of Ron and variable capacitor Con and Coff. Also shown coupled to the common output fto is a distributed load capacitor $C_D$ and a following stage CMOS p31 and n31.

Figure 1B:
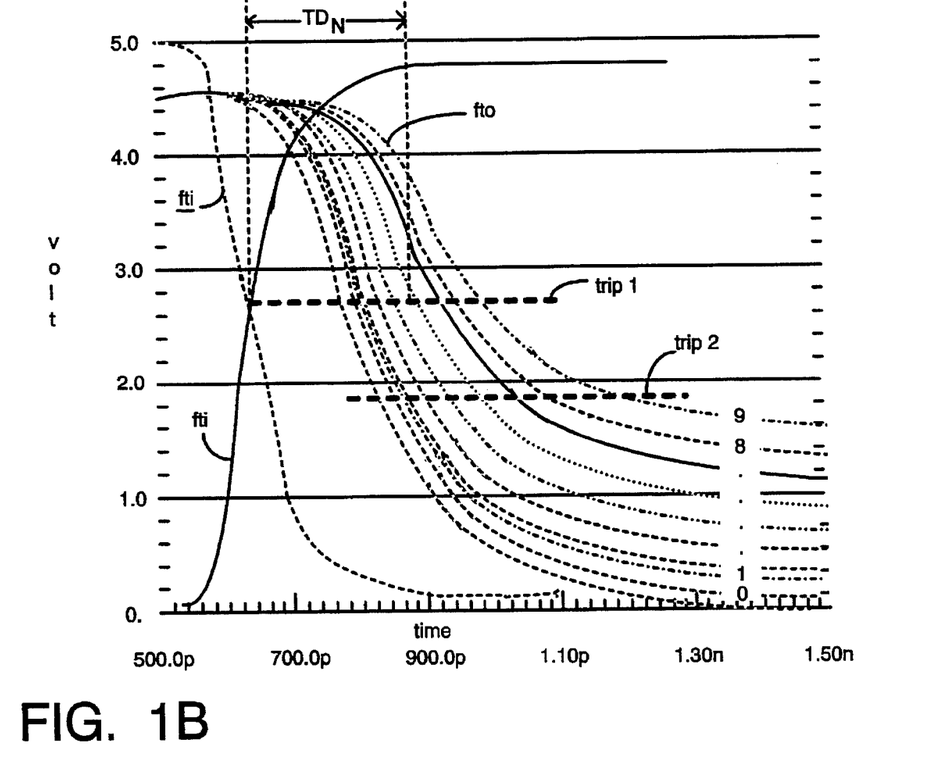
FIG. 1B is the timing diagram application to FIG. 1A.

FIG. 1B is illustrative of the response of CMOS circuit of FIG. 1A to the rising edge of an input step signal fti. Since the CMOS is an inverter, fto is inverted and has a delay IDn with respect to fti. The response of the FIG. 1A circuit to a falling edge of fti will be delayed at fto by a small fixed amount, but the delay will not depend on the value of Ron or Con but will be controlled by the fixed value of the distributed capacitance $C_D$. However, the response to the rising edge of fti will respond as shown in FIG. 1B to the values of the Ron and Con. In FIG. 1B, if Ron is set at a maximum value, the delay value is seen to be a maximum, i.e. curve 9. If the resistance of Ron is set in increments, for example 10 increments, curve 0 is a minimum value of resistance and the corresponding delay of fto is a minimum. Assume that the trip point for the next stage is the voltage value represented by the line in FIG. 1B called Trip 1, then it can be seen that the incremental delay differences between each curve 0 and curve 1 is much smaller than the nominal stage delay TDn. Accordingly, it can be seen that for the region where the trip voltage is greater than 2.2 volts, the curves are very close to linear and that the incremental time delay values corresponding to each of the curves are reasonably equal. These are the characteristics which we utilize in our invention to provide controllable time delay values which are less than the delay of a single inverter stage in precisely controllable increments.

With respect to FIG. 1B, before the start of the rising transition of fti at time t=500 ps, the value of fti is low and n21 is off and p21 is on and fto is high. The nominal inverse fti is shown in FIG. 1B for illustration purposes to enable comparison with the inverted output fto. When fto is high, $C_D$ is charged to VCC. During the transition, p21 is turning off and n21 is turning on. A discharge current $I_o$ starts to flow which causes a voltage to drop across Ron at the node mid, and the capacitors formed by on-capacitance Con and the off-capacitance Coif become charged. Con is the capacitance of the MOS devices variable resistances which are on, and Coff is the capacitance of variable resistances in circuit 1 which are off. If Ron is large, a large voltage at mid appears, so that the fto at the common point between p21 and n21 is reduced to VCC–$I_o$(t) Ron during the transaction.

Figure 2:
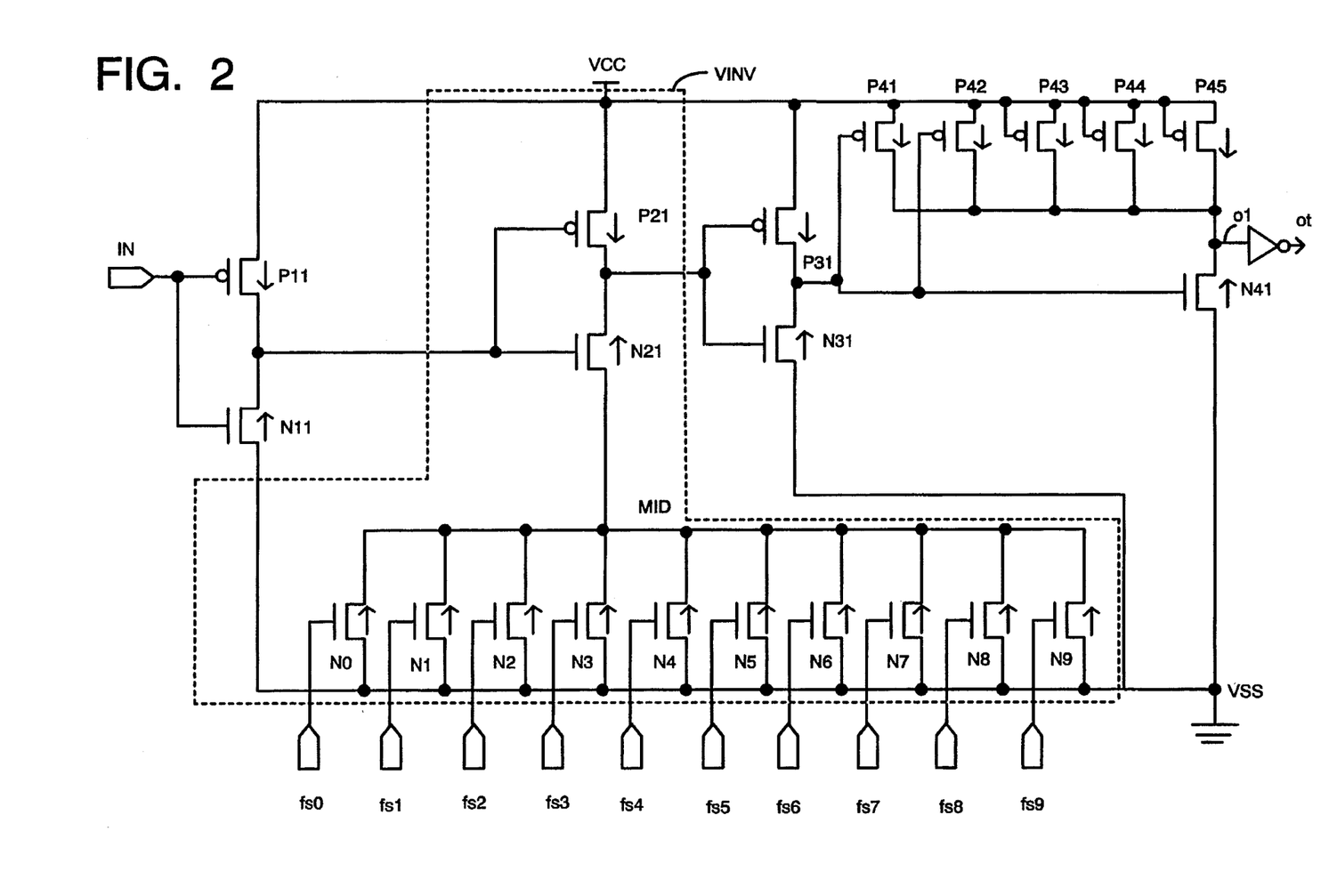
FIG. 2 is the circuit of one embodiment of the invention.

With reference to FIG. 2 we show the preferred embodiment of our invention for providing a small controllable increment delay circuit. The circuit in the dashed box VINV is the same circuit shown in FIG. 1A except that Ron, Con and Coff are provided by a circuit including ten parallel n-channel MOS gates N0 through N9 connected between node mid and $V_{SS}$. The gate terminals of the n-channel MOS devices are connected to control signals FS0, FS1 through FS9. When minimal resistance is desired, all the control signals FS0 through FS9 are set high so that all the MOS gates $$R_{ON} = \frac{1}{\frac{1}{RN0} + \ldots + \frac{1}{RN9}}$$

In this state, Con=$C_{0on}$+ ... $C_{9on}$. If a maximum resistance is desired, FS0 is high and FS1 through FS9 are low. In this event Ron=Ro and $C_0$on=CN0 and Coff=$C_{off}$+ ... $C_{9off}$ where total capacitance=Con +Coff.

FIG. 2 shows that the first inverter pair of CMOS transistors p11 and n11 have their gates commonly connected to the signal in. The source of p11 is connected to VCC and the source of n11 is connected to $V_{SS}$. The common drains are node fti which corresponds to fti node of FIG. 1A and is the input to the adjustable time delay generator stage VINV. The fto node is coupled to a CMOS pair p31 and n31 also coupled to the supplies in the same manner as p11 and n11. The common drain output abc is coupled to the gate of n-channel MOS n41 which is coupled to p-channel MOS transistors p41 through p45. The gates of p41 and p42 are connected to node abc and their sources are connected to VCC. The drains of p41 through p45 are coupled to the drain of n41, whose source is connected to $V_{SS}$. The drain of n41 is the output node ol.

Figure 3:
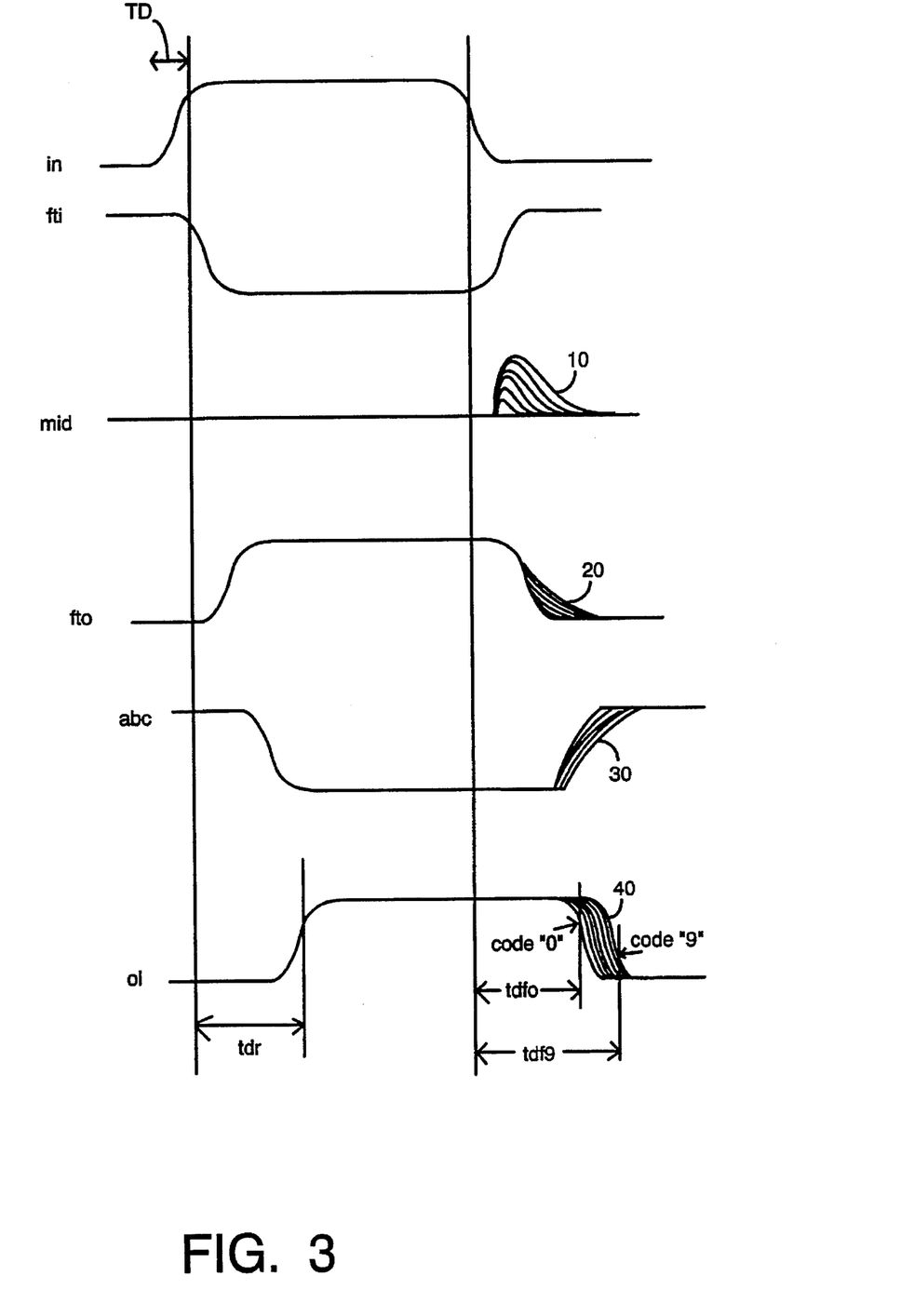
FIG. 3 is the timing diagram applicable to a circuit according to FIG. 2.

FIG. 3 is the timing diagram for the voltages of the nodes called in, fti, mid, fto, abc and ol of FIG. 2.

Figure 4:
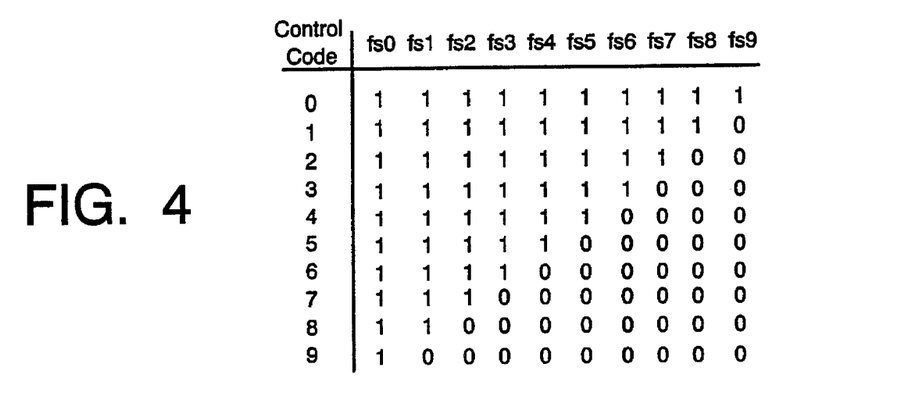
FIG. 4 is a code truth table for FIG. 2.

The family curve variations shown at 10, 20, 30 and 40 are indicative of the alternate waveforms depending on which of the transistors FS0 through FS9 are energized. The minimum time delay $t_{dfo}$ will result if Code 0 is selected and the maximum time delay will result if Code 9 is selected. FIG. 4 illustrates one embodiment of a truth table for a 10 bit code word for selecting 10 increments of delay with control codes 0 through 9 which elect progressively fewer transistors in parallel for the VINV circuit. A different number of control gates could be employed for finer increments if desired and a code converter could be used with a 4 bit code to provide 16 unique codes.

Figure 5:
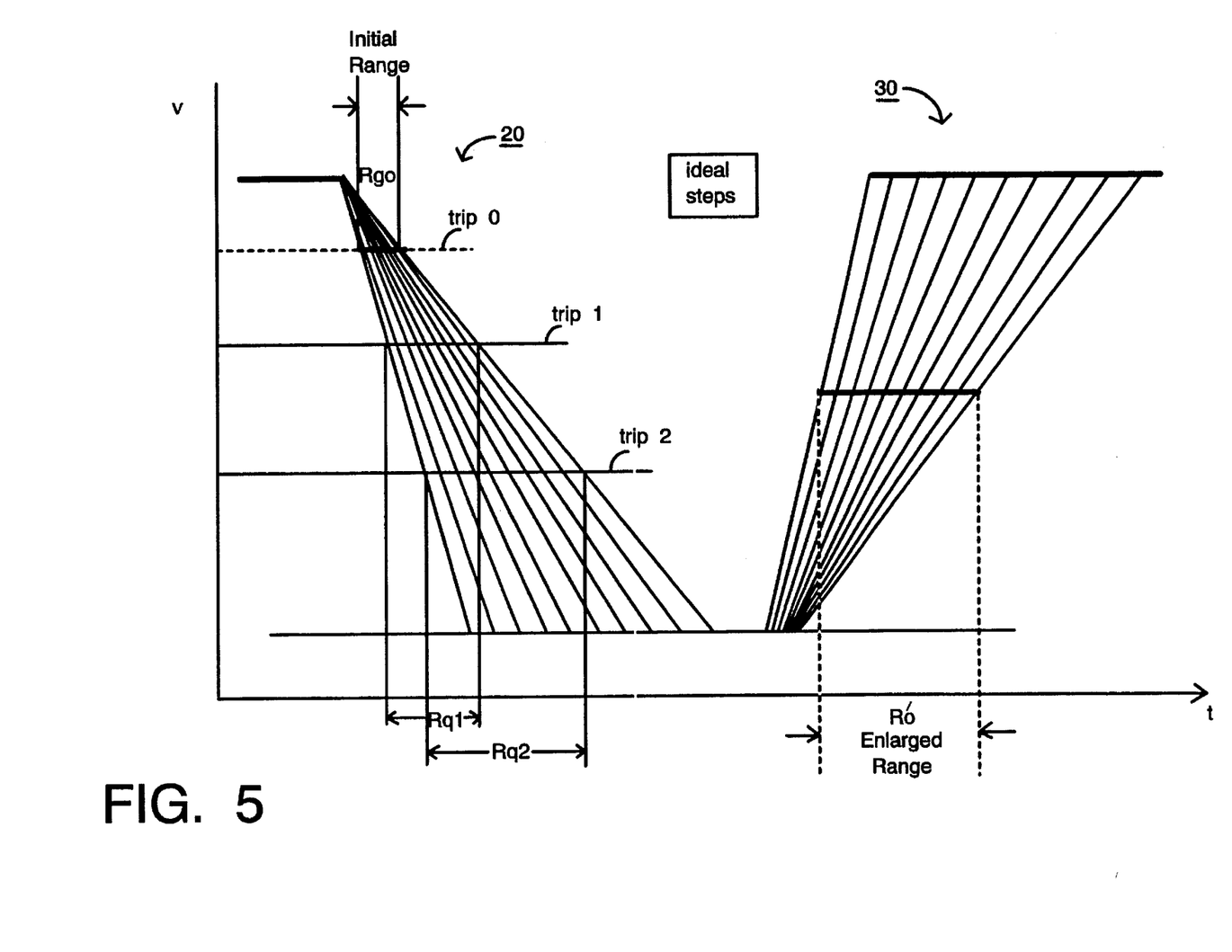
FIG. 5 is an idealized rise and fall wave forms according to the invention.

With reference to FIG. 5, the idealized waveform family 20 of a portion of FIG. 1B is shown to illustrate the operative features of the falling edge of these curves at fto. There are two parameters which are controllable to effect the delay. The trip voltage of the next stage n31 and p31 from FIG. 2 can be adjusted to determine the range of the delay from minimum to maximum delay. At trip0 voltage on the n31/p31 transistor, the range delays are $R_{g0}$. As the trip voltage level decreases to trip1, trip2 level, etc., it is seen that the range of the delay increases $R_{g1}$, $R_{g2}$ respectively.

The other parameter which is adjustable is the slope, i.e. slew rate, of the falling edge for each code, and accordingly the delay step sizes are also controllable. The slew rates can be controllable as a function of the ratio of the channel widths of the CMOS transistors of the p-channel to the n-channel. This ratio is called the aspect ratio=Wp/Wn. By selecting the Wp/Wn ratio of the following stages p31/n31 and (p41+p42)/n41, the delay step size and the total delay range at the output ol can be fine tuned as desired, such as for example, adjusting the parameters so that ten steps equals the delay of a single inverter stage.

Figure 6:
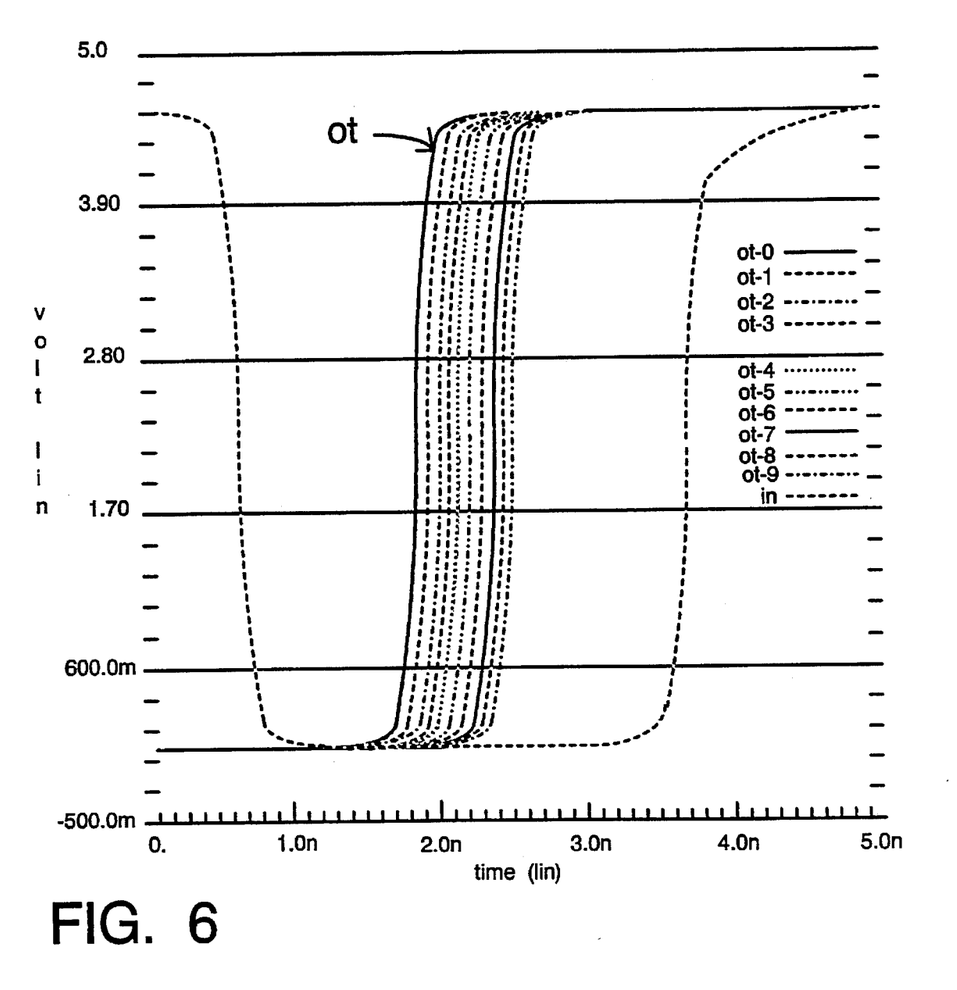
FIG. 6 is illustrative of the output delay increments according to the invention.

As long as the trip point occurs in the generally linear portion of the falling edge of the family of curves as shown in FIG. 5, the output at ot, FIG. 2, will appear as shown in FIG. 6 and all the rising edges of the family are seen to be parallel with the same slope so that the delays will not be sensitive to the trip point of any following loading stages.

A type of amplification of the delay step size and total range, as shown in FIG. 5 in family curve 30, is illustrative of the corresponding rising edge at node abc. This is due to the fact that the delay is also dependent on the input slope.

Figure 7:
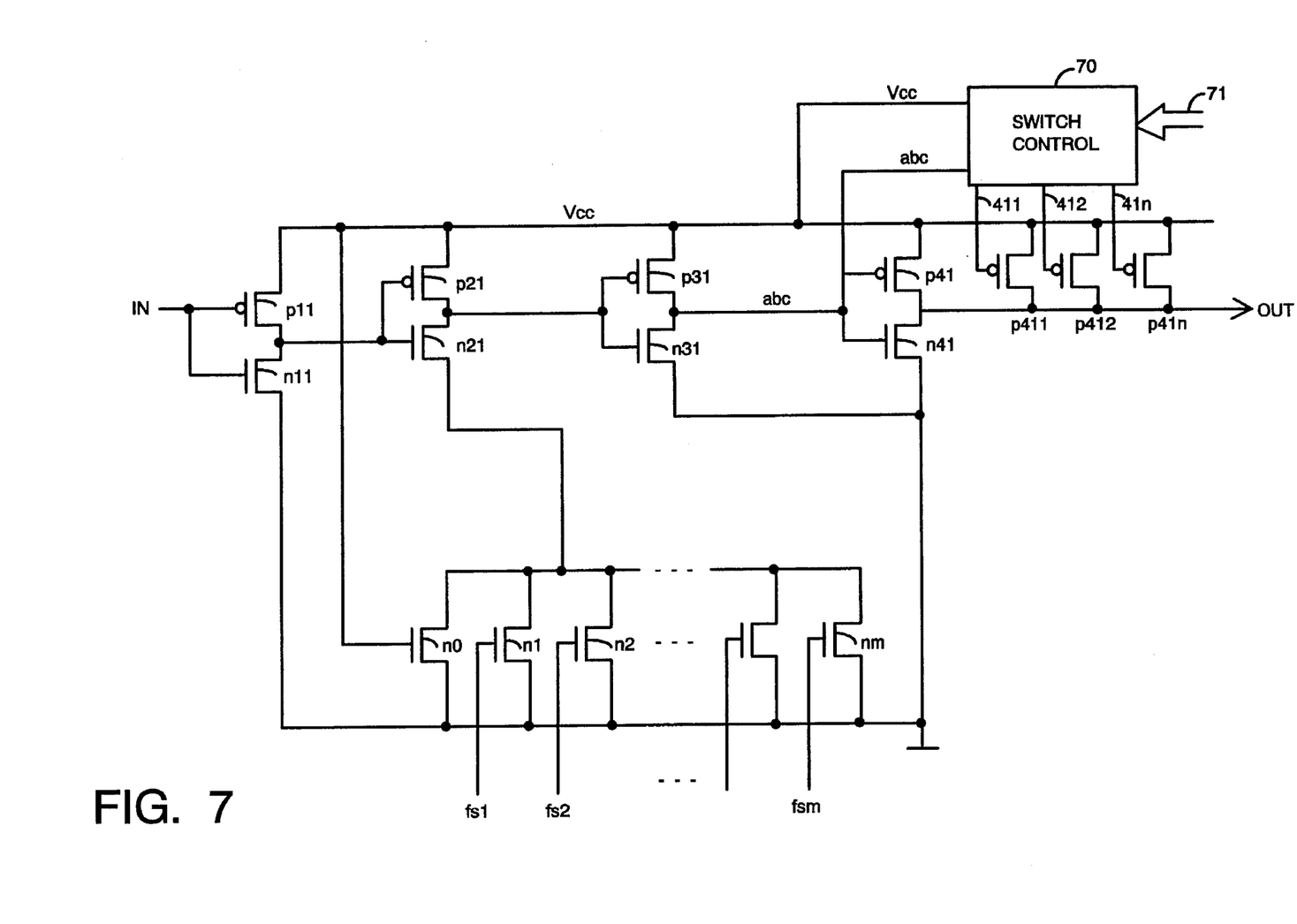
FIG. 7 is another embodiment of the invention.

FIG. 7 illustrates another embodiment of the invention which permits programmable and real time delay step size and delay range calibration. As described in connection with FIG. 5, the family of curves 30 are adjustable by changing the aspect ratio of the channel widths of the p to n channel transistors. By providing a plurality of p-channel MOS transistors which can be switched to be parallel with the p-channel portions of the CMOS p41/n41, the aspect ratio of p41/n41 is programmable.

Figure 8:
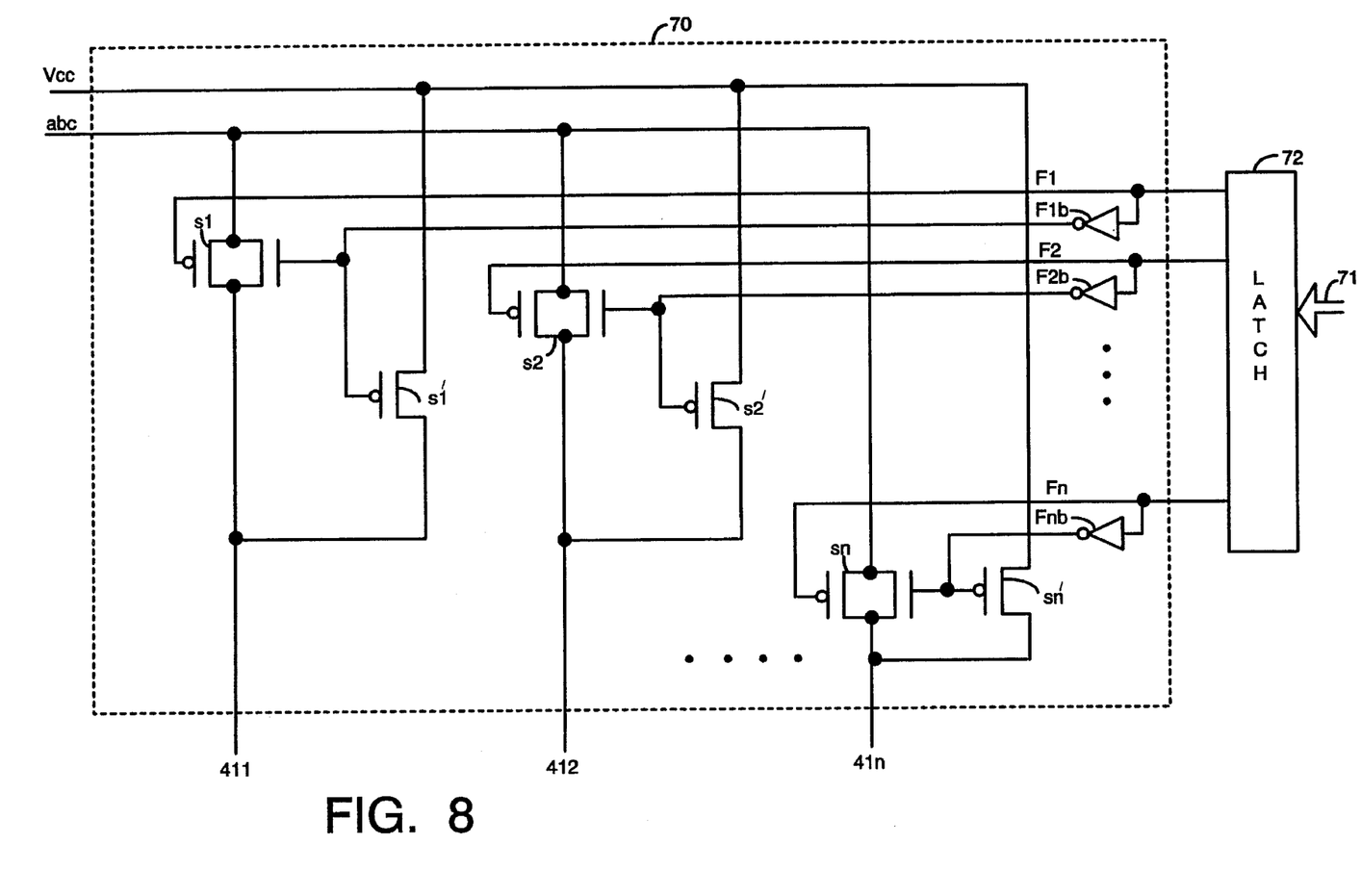
FIG. 8 is a circuit to carry out the embodiment of FIG. 7.

In FIG. 7, the p-channel MOSFET p411, p412, ... p41n are connected to the common drain of the CMOS p41/n41. The gate of each of the MOSFETs p411, p412 ... p41n are connected to switch control 70. Switch Control 70, responsive to the command bus 71, will switch the selected gate electrode of any of the selected transistors between either VCC or abc. If a gate is coupled to VCC, the FET is open. If the gate is coupled to abc, the FET is activated in parallel with the p41 and provides an effective p-channel increase in channel width. FIG. 8 is a circuit diagram for switch control 70 which enables the programmable switching of the gates of p411, p412 ... p41 n. The leads from the gates of the p-channel transistors 411, 412 ... 41n are each coupled to transmission gate and a pair of p-channel MOSFET. For example, lead 411 is coupled to the drain of transmission gate S1 and p-channel MOSFET Sl'. The source of S1 is coupled to abc and the source of Sl' is coupled to VCC. The gate of S1 and Sl' are coupled to complimentary outputs F1 and Fib, FF1, which can be set into a selected state by latch 72. Each of the other gate leads 412 ... 41n are also connected to transmission gates and FET switches which are controlled by a corresponding latch outputs. This arrangement enables a user to program, as well as change in real time, the delay calibration.

This invention has been described in conjunction with the above described preferred embodiments. However, the invention is not intended to be restricted to those embodiments and the scope of the invention shall be determined by the claims. With this in view,

We claim the following:

1. A time delay circuit comprising:

a first CMOS field effect pair of transistors connected as an inverter, each said transistor of said first pair of transistors having a gate, source and drain, wherein said gates are connected together and said drains are connected together, said first CMOS field effect transistor having an intrinsic transit time delay equal to TD;

a digitally variable RC network coupled between the source of one of said first CMOS field effect transistors and a first reference voltage, said digitally variable network including means to provide a first variable impedance having a selectable substantially equal increments of said first variable impedance in response to a digital code;

a second CMOS field effect pair of transistors having gates, sources and drains, said gates being connected together and said drains of said second CMOS field effect pair of transistors being connected together, said gates of said second CMOS field effect pair of transistor being connected to said drains of said first CMOS field effect pair of transistors;

terminal means for receiving and coupling a pulse to be delayed to said common gate of said first CMOS field effect pair of transistors, said common drain of said second CMOS field effect pair of transistors, in operation, providing a selectably delayed copy of said pulse to be delayed, whereby said selectable delay is TD plus a selectable increment less than TD;

wherein the number of said selectable delay values is n where each step is TD/n, and the total range is kTD where k is equal to or less than 1, and wherein the signal on said drains of said first CMOS field effect transistor in response to a pulse applied to said terminal means for receiving exhibits a linear portion and a non-linear portion; and wherein said second CMOS field effect pair of transistors has a trip voltage and wherein said trip voltage is adjustable and is set to cause said second CMOS field effect transistor to switch when said signal on said drains of said first CMOS field effect transistor is in the linear portion of said signal and wherein when said trip voltage is decreased, the time delay corresponding to each step TD/n is increased.

2. The delay circuit of claim 1 wherein said second CMOS field effect pair of transistors has a p-channel and an n-channel and wherein the total delay range of the circuit is adjustable by adjusting k, and where k equals the ratio of the total width of the p-channel to the width of the n-channel.

3. The delay circuit of claim 2 wherein the said width of the p-channel is increased by the connection of additional p-channel MOS transistors in parallel with the p-channel of said second CMOS field effect pair of transistors.

4. The delay circuit of claim 3 further including user programmable means for controlling the width of said p-channel, said user programmable means having a latch for cooperating with a control bus for storing programmed information and controlling the number of said p-channel MOS transistors to be connected.

* * * * *